(12) United States Patent
Zhang et al.

(10) Patent No.: US 10,509,425 B2
(45) Date of Patent: Dec. 17, 2019

(54) VIRTUAL METROLOGY METHOD FOR ESC TEMPERATURE ESTIMATION USING THERMAL CONTROL ELEMENTS

(71) Applicant: Lam Research Corporation, Fremont, CA (US)

(72) Inventors: Tao Zhang, San Ramon, CA (US); Jorge Jose Zaninovich, Walnut Creek, CA (US); Fred Egley, Sunnyvale, CA (US)

(73) Assignee: LAM RESEARCH CORPORATION, Fremont, CA (US)

( * ) Notice: Subject to any disclaimer, the term of this patent is extended or adjusted under 35 U.S.C. 154(b) by 184 days.

(21) Appl. No.: 15/411,389

(22) Filed: Jan. 20, 2017

(65) Prior Publication Data

US 2018/0210473 A1    Jul. 26, 2018

(51) Int. Cl.
*G05D 23/19* (2006.01)
*H01L 21/67* (2006.01)

(52) U.S. Cl.
CPC .... *G05D 23/1917* (2013.01); *H01L 21/67103* (2013.01); *H01L 21/67109* (2013.01); *H01L 21/67248* (2013.01)

(58) Field of Classification Search
CPC ............................ G05D 23/1917; G05B 17/02
See application file for complete search history.

(56) References Cited

U.S. PATENT DOCUMENTS

| | | | |
|---|---|---|---|
| 6,605,955 B1 * | 8/2003 | Costello ............ | H01L 21/67109 324/750.09 |
| 2002/0183977 A1 * | 12/2002 | Sui .................... | H01J 37/32935 702/188 |
| 2006/0291132 A1 | 12/2006 | Kanno et al. | |
| 2013/0270252 A1 | 10/2013 | Ambal et al. | |
| 2015/0132863 A1 | 5/2015 | Oohashi | |
| 2016/0372355 A1 | 12/2016 | Zhang et al. | |

FOREIGN PATENT DOCUMENTS

JP    H10116885 A    5/1998

OTHER PUBLICATIONS

Shi et al., "Set Point Response and Disturbance Rejection Tradeoff for Second-Order Plus Dead Time Process", 2004 5th Asian Control Conference (Year: 2004).*
Notification of Transmittal of International Search Report and the Written Opinion of the International Searching Authority dated Jun. 21, 2018 corresponding to International Application No. PCT/US2018/014191, 10 pages.

* cited by examiner

*Primary Examiner* — Carlos R Ortiz Rodriguez

(57) ABSTRACT

A temperature controller for a substrate support in a substrate processing system includes memory that stores a first model correlating temperatures of a plurality of first thermal control elements (TCEs) arranged in the substrate support and first temperature responses of the substrate support. The first temperature responses correspond to locations on a surface of the substrate support. A temperature estimation module calculates resistances of the first TCEs, determines, based on the calculated resistances, the temperatures of the first TCEs, and estimates, using the stored first model and the determined temperatures of the first TCEs, an actual temperature response of the substrate support. The temperature controller is configured to control the first TCEs based on the actual temperature response of the substrate support.

16 Claims, 10 Drawing Sheets

US 10,509,425 B2

VIRTUAL METROLOGY METHOD FOR ESC TEMPERATURE ESTIMATION USING THERMAL CONTROL ELEMENTS

FIELD

The present disclosure relates to substrate processing systems, and more particularly to systems and methods for estimating temperatures of a substrate support in a substrate processing system.

BACKGROUND

The background description provided here is for the purpose of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

Substrate processing systems may be used to perform etching, deposition, and/or other treatment of substrates such as semiconductor wafers. Example processes that may be performed on a substrate include, but are not limited to, a plasma enhanced chemical vapor deposition (PECVD) process, a chemically enhanced plasma vapor deposition (CEPVD) process, a sputtering physical vapor deposition (PVD) process, an ion implantation process, and/or other etch (e.g., chemical etch, plasma etch, reactive ion etch, etc.), deposition, and cleaning processes. A substrate may be arranged on a substrate support, such as a pedestal, an electrostatic chuck (ESC), etc. in a processing chamber of the substrate processing system. For example, during etching, a gas mixture including one or more precursors is introduced into the processing chamber and plasma is struck to etch the substrate.

During process steps, temperatures of various components of the system, and the substrate itself, may vary. These temperature variations may have undesirable effects on the resulting substrates (e.g., non-uniform critical dimensions). Temperature variations may produce desirable effects on the substrates. For example, if non-uniformities are present in the substrate prior to etching, spatial control of temperature and the etching process may be used to correct for the non-uniformities. Accordingly, substrate processing systems may implement various systems and methods for estimating temperatures of various components and the substrates during processing.

SUMMARY

A temperature controller for a substrate support in a substrate processing system includes memory that stores a first model correlating temperatures of a plurality of first thermal control elements (TCEs) arranged in the substrate support and first temperature responses of the substrate support. The first temperature responses correspond to locations on a surface of the substrate support. A temperature estimation module calculates resistances of the first TCEs, determines, based on the calculated resistances, the temperatures of the first TCEs, and estimates, using the stored first model and the determined temperatures of the first TCEs, an actual temperature response of the substrate support. The temperature controller is configured to control the first TCEs based on the actual temperature response of the substrate support.

A method of estimating temperatures of a substrate support in a substrate processing system includes storing a first model correlating temperatures of a plurality of first thermal control elements (TCEs) arranged in the substrate support and first temperature responses of the substrate support. The first temperature responses correspond to locations on a surface of the substrate support. The method further includes calculating resistances of the first TCEs, determining, based on the calculated resistances, the temperatures of the first TCEs, estimating, using the stored first model and the determined temperatures of the first TCEs, an actual temperature response of the substrate support, and controlling the first TCEs based on the actual temperature response of the substrate support.

Further areas of applicability of the present disclosure will become apparent from the detailed description, the claims and the drawings. The detailed description and specific examples are intended for purposes of illustration only and are not intended to limit the scope of the disclosure.

BRIEF DESCRIPTION OF THE DRAWINGS

The present disclosure will become more fully understood from the detailed description and the accompanying drawings, wherein.

In the drawings, reference numbers may be reused to identify similar and/or identical elements.

DETAILED DESCRIPTION

Figure 1:
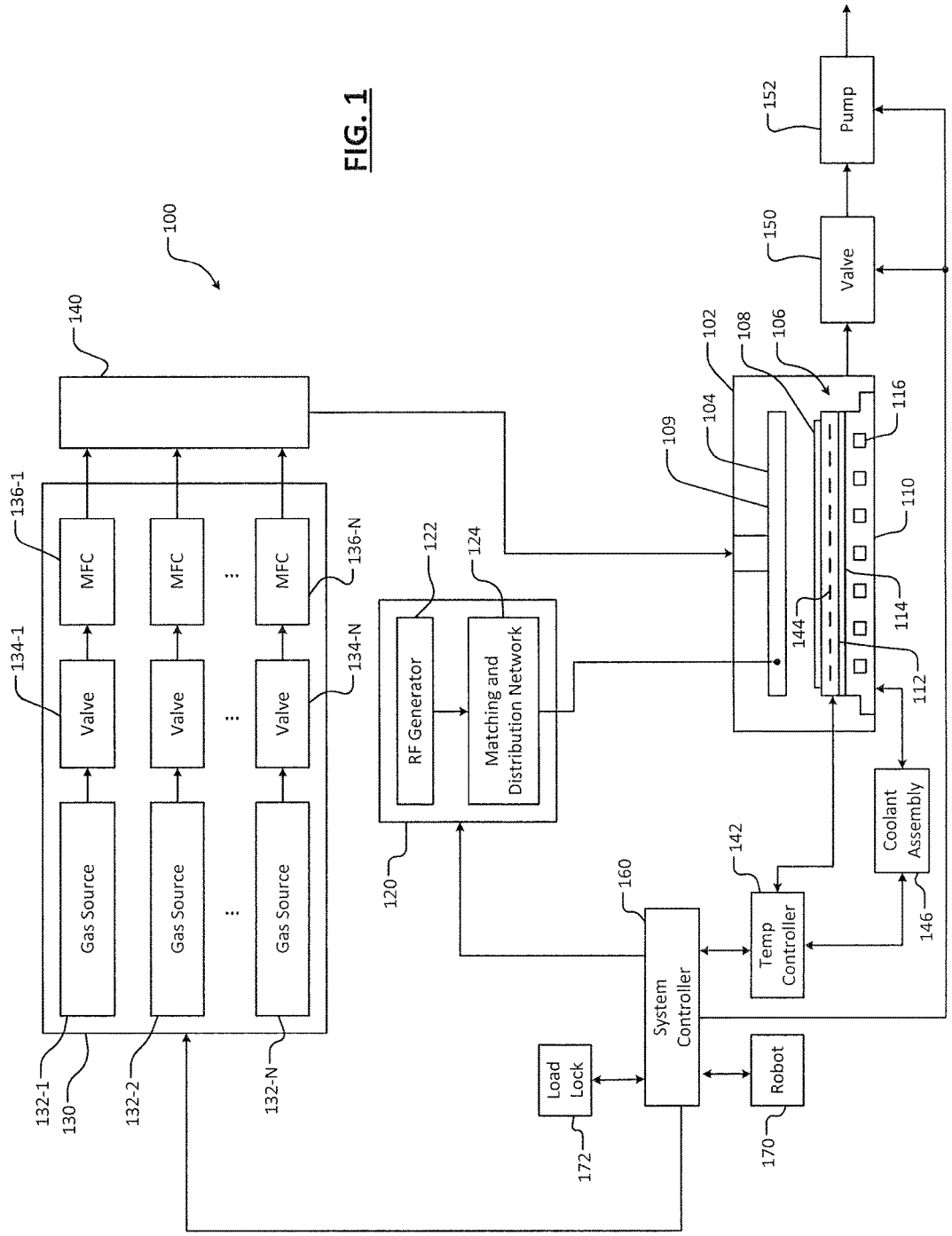
FIG. 1 is a functional block diagram of an example substrate processing system including an electrostatic chuck according to the principles of the present disclosure.

In a substrate processing system, temperatures of a substrate support, such as an electrostatic chuck (ESC), may be controlled during process steps. For example, different processes and respective steps may require that a substrate is maintained at different temperatures. A contact surface temperature of the ESC may be controlled to maintain the substrate at desired temperatures. For example only, the ESC may include a heating plate (e.g., a ceramic heating plate). The substrate may be arranged on the heating plate. Accordingly, the temperature of the heating plate is controlled to achieve the desired temperatures of the substrate.

Variations in the manufacturing process may cause corresponding variations in the characteristics of the heating plate and the performance of the temperature control of the heating plate. For example, variations (i.e., non-uniformities) may include, but are not limited to, local variations in thicknesses and/or thermal conductivity of layers in the construction of the heating plate, variations in the flatness of machined surfaces, and/or variations in characteristics of respective thermal control elements (TCEs) within the heating plate. These non-uniformities may result in local differences in heat transfer (i.e., local temperature non-uniformity), and therefore non-uniformities in substrate temperatures.

Other system variations may further affect the temperature non-uniformities. The other system variations may include, but are not limited to, variations between different substrate processing chambers, variations between process steps (e.g., the presence, type, amount, duration, etc. of a plasma step), differences between a temperature within the chamber and the temperature of the ESC, variations in process parameters (e.g., power, frequency, etc.), variations between individual wafers, and/or variations in user inputs/constraints.

It may be difficult to accurately control and/or measure some conditions within a substrate processing chamber (i.e., in situ) during operation. Accordingly, substrate processing systems may implement virtual metrology to estimate conditions within the substrate processing chamber. For example, virtual metrology systems and methods may implement mathematical models that associate actual measured conditions (e.g., in situ measurements taken using respective sensors) to other conditions and characteristics.

Systems and methods according to the principles of the present disclosure implement virtual metrology to estimate temperatures of the ESC (e.g., surface temperatures of the ESC, which may correspond to temperatures of a wafer being processed on the ESC). For example, some substrate processing systems may implement a combination of macro TCEs and micro TCEs to compensate for temperature non-uniformities in the ESC. In one example implementation, an ESC including one or multiple zones (e.g., a multi-zone ESC) may include respective macro TCEs for each zone of a heating plate and a plurality of micro TCEs distributed throughout the heating plate. The plurality of micro TCEs (which may be referred to herein as "heaters") may be individually controlled to compensate for the temperature non-uniformities in each zone of the ESC. The systems and methods of the present disclosure model ESC temperatures as a function of operating characteristics of the micro TCEs. For example, the micro TCEs according to the principles of the present disclosure may comprise a material having a high thermal sensitivity (e.g., tungsten metal alloys).

In this manner, temperatures of the substrate during processing may be more accurately estimated as process variations affect relationships between the substrate, the ESC, and other components (e.g., baseplate temperature, power supplied to the baseplate, etc.) of the substrate processing system. In some examples, additional temperature sensors in each of the zones of the ESC may be eliminated. Although described with respect to ESC temperature estimation, the principles of the present disclosure as described herein may also be applied to estimating other substrate processing variables, such as wafer level bias RF voltage, etch rate, etc.

Referring now to FIG. 1, an example substrate processing system 100 for performing etching using RF plasma is shown. The substrate processing system 100 includes a processing chamber 102 that encloses other components of the substrate processing chamber 102 and contains the RF plasma. The substrate processing chamber 102 includes an upper electrode 104 and a substrate support, such as an electrostatic chuck (ESC) 106. During operation, a substrate 108 is arranged on the ESC 106.

For example only, the upper electrode 104 may include a showerhead 109 that introduces and distributes process gases. The showerhead 109 may include a stem portion including one end connected to a top surface of the processing chamber. A base portion is generally cylindrical and extends radially outwardly from an opposite end of the stem portion at a location that is spaced from the top surface of the processing chamber. A substrate-facing surface or faceplate of the base portion of the showerhead includes a plurality of holes through which process gas or purge gas flows. Alternately, the upper electrode 104 may include a conducting plate and the process gases may be introduced in another manner.

The ESC 106 includes a conductive baseplate 110 that acts as a lower electrode. The baseplate 110 supports a heating plate 112, which may correspond to a ceramic multi-zone heating plate. A thermal resistance layer 114 may be arranged between the heating plate 112 and the baseplate 110. The baseplate 110 may include one or more coolant channels 116 for flowing coolant through the baseplate 110.

An RF generating system 120 generates and outputs an RF voltage to one of the upper electrode 104 and the lower electrode (e.g., the baseplate 110 of the ESC 106). The other one of the upper electrode 104 and the baseplate 110 may be DC grounded, AC grounded or floating. For example only, the RF generating system 120 may include an RF voltage generator 122 that generates the RF voltage that is fed by a matching and distribution network 124 to the upper electrode 104 or the baseplate 110. In other examples, the plasma may be generated inductively or remotely.

A gas delivery system 130 includes one or more gas sources 132-1, 132-2, . . . , and 132-N (collectively gas sources 132), where N is an integer greater than zero. The gas sources supply one or more precursors and mixtures thereof. The gas sources may also supply purge gas. Vaporized precursor may also be used. The gas sources 132 are connected by valves 134-1, 134-2, . . . , and 134-N (collectively valves 134) and mass flow controllers 136-1, 136-2, . . . , and 136-N (collectively mass flow controllers 136) to a manifold 140. An output of the manifold 140 is fed to the processing chamber 102. For example only, the output of the manifold 140 is fed to the showerhead 109.

A temperature controller 142 may be connected to a plurality of thermal control elements (TCEs) 144 arranged in the heating plate 112. For example, the TCEs 144 may include, but are not limited to, respective macro TCEs corresponding to each zone in a multi-zone heating plate and/or an array of micro TCEs disposed across multiple zones of a multi-zone heating plate as described in more detail in FIGS. 2A and 2B. The temperature controller 142 may be used to control the plurality of TCEs 144 to control a temperature of the ESC 106 and the substrate 108.

The temperature controller 142 may communicate with a coolant assembly 146 to control coolant flow through the channels 116. For example, the coolant assembly 146 may include a coolant pump and reservoir. The temperature controller 142 operates the coolant assembly 146 to selectively flow the coolant through the channels 116 to cool the ESC 106.

A valve 150 and pump 152 may be used to evacuate reactants from the processing chamber 102. A system controller 160 may be used to control components of the substrate processing system 100. A robot 170 may be used to deliver substrates onto, and remove substrates from, the ESC 106. For example, the robot 170 may transfer substrates between the ESC 106 and a load lock 172. Although shown as separate controllers, the temperature controller 142 may be implemented within the system controller 160. The temperature controller 142 may be further configured to implement one or more models to estimate temperatures of the ESC 106 according to the principles of the present disclosure.

Figure 2A:
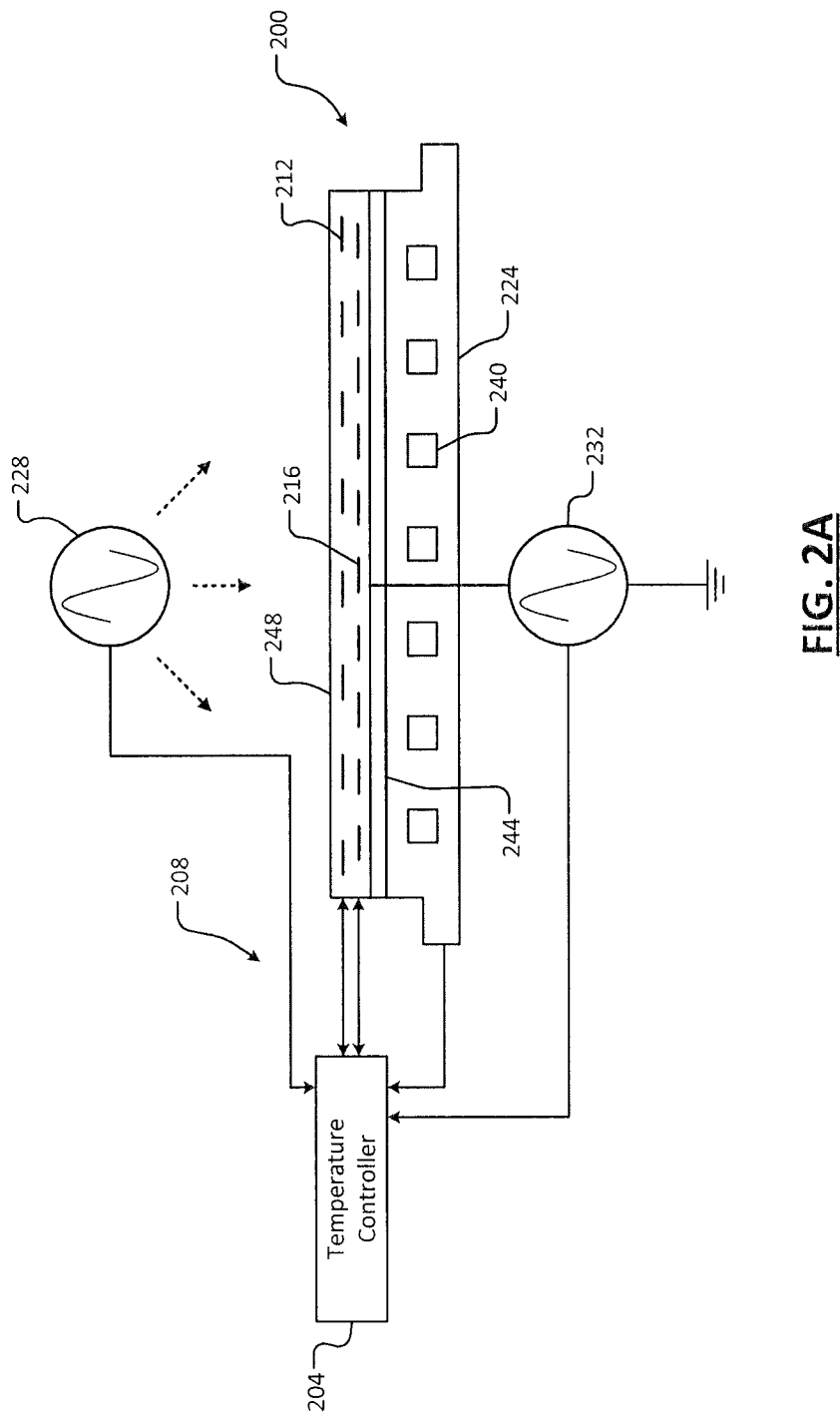
FIG. 2A is an example electrostatic chuck according to the principles of the present disclosure.
Figure 2C:
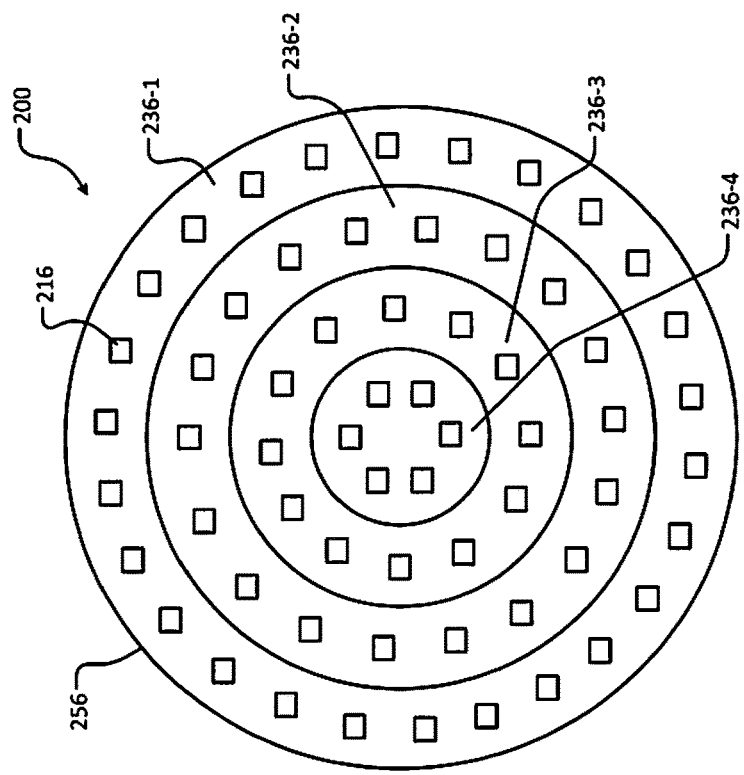
FIG. 2C illustrates zones and micro thermal control elements of an example electrostatic chuck according to the principles of the present disclosure.
Figure 2B:
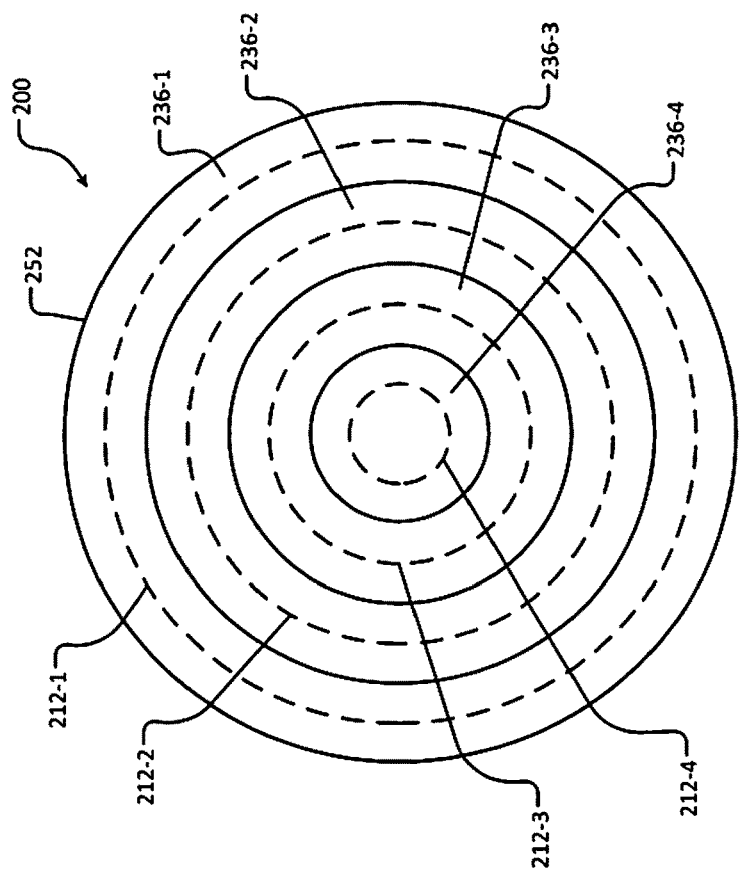
FIG. 2B illustrates zones and macro thermal control elements of an example electrostatic chuck according to the principles of the present disclosure.

Referring now to FIGS. 2A, 2B, and 2C, an example ESC 200 is shown. A temperature controller 204 communicates with the ESC 200 via one or more electrical or communication connections 208. For example, the electrical connections 208 may include connections for providing voltage/power to control macro TCEs 212-1, 212-2, 212-3, and 212-4, referred to collectively as macro TCEs 212, and/or micro TCEs 216. The connections 208 may further include connections for receiving feedback, such as temperature feedback from a baseplate 224 (for example only, from a baseplate sensor), measurements of voltage and/or current provided to the micro TCEs 216, feedback indicative of RF power provided from an RF plasma source (e.g., a transformer coupled plasma, or TCP, source) 228, feedback indicative of bias RF power provided from a bias RF source 232 to the ESC 200, etc. Although the micro TCEs 216 as shown in FIGS. 2B and 2C are aligned with the macro TCEs 212 in a circular, concentric arrangement, other arrangements of the micro TCEs 216 with respect to the macro TCEs 212 may be used.

As shown, the ESC 200 is a multi-zone ESC including zones 236-1, 236-2, 236-3, and 236-4, referred to collectively as zones 236. Although shown with the four concentric zones 236, in embodiments the ESC 200 may include one, two, three, or more than four of the zones 236. The shapes of the zones 236 may vary. For example, the zones 236 may be provides as quadrants or another grid-like arrangement. Each of the zones 236 includes, for example only, a respective one of the macro TCEs 212. For example, the baseplate 224 includes coolant channels 240, a thermal resistance layer 244 formed on the baseplate 224, and a multi-zone ceramic heating plate 248 formed on the thermal resistance layer 244. The heating plate 248 may include multiple bonded layers, including a first layer 252 as shown in FIG. 2B and a second layer 256 as shown in FIG. 2C. The first layer 252 includes the macro TCEs 212 and the second layer 256 includes the plurality of micro TCEs 216.

The temperature controller 204 controls the macro TCEs 212 and the micro TCEs 216 according to a desired setpoint temperature. For example, the temperature controller 204 may receive (e.g., from the system controller 160 as shown in FIG. 1) a setpoint temperature for one or more of the zones 236. For example only, the temperature controller 204 may receive a same setpoint temperature for all or some of the zones 236 and/or different respective setpoint temperatures for each of the zones 236. The setpoint temperatures for each of the zones 236 may vary across different processes and different steps of each process.

The temperature controller 204 controls the macro TCEs 212 for each of the zones 236 based on the respective setpoint temperatures and temperature feedback. For example, the temperature controller 204 individually adjusts power (e.g., current) provided to each of the macro TCEs 212 to achieve the setpoint temperatures. The macro TCEs 212 may each include a single resistive coil or other structure schematically represented by the dashed lines of FIG. 2B. Accordingly, adjusting one of the macro TCEs 212 affects the temperature of the entire respective zone 236, and may also affect other ones of the zones 236.

Conversely, the temperature controller 204 may individually control each of the micro TCEs 216 to locally adjust temperatures of the zones 236. For example, although each micro TCE 216 may be located entirely within one of the zones 236, adjusting a thermal output of any one of the micro TCEs 216 may have a thermal impact across multiple zones 236 and localities of the heating plate 248. Accordingly, one or more of the micro TCEs 216 may be selectively activated and/or deactivated to further adjust temperatures of the zones 236. The temperature controller 204 implements the systems and methods according to the present disclosure to estimate temperatures of the ESC 200 as described below in more detail.

Figure 3:
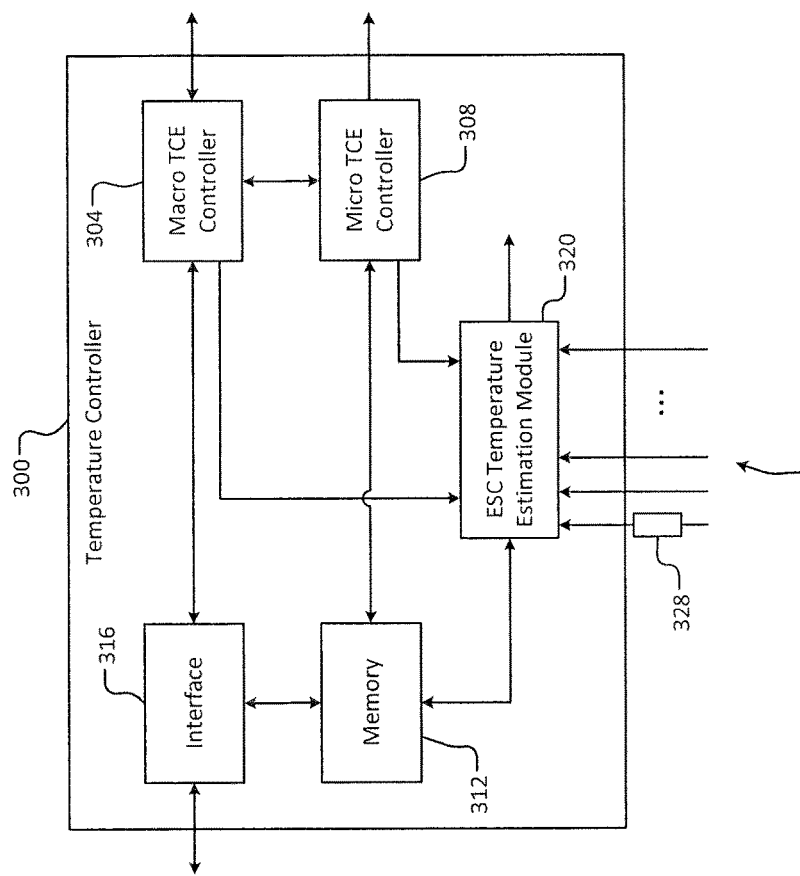
FIG. 3 is an example temperature controller according to the principles of the present disclosure.

Referring now to FIG. 3, an example temperature controller 300 according to the principles of the present disclosure includes a macro TCE controller 304 and a micro TCE controller 308 (which, in embodiments, may be implemented as a single controller), memory 312, and an interface 316 (for communicating with, for example, the system controller 160 as shown in FIG. 1, for receiving user inputs, etc.), and an ESC temperature estimation module 320. For example only, the memory 312 may include non-volatile memory such as flash memory. The temperature controller 300 receives process setpoint temperatures (e.g., desired setpoint temperatures for respective process steps) and/or other parameters from the system controller 160 via the interface 316. The interface 316 provides the process setpoint temperatures to the macro TCE controller 304. The process setpoint temperatures may include a single setpoint temperature for every zone 236 and/or different process setpoint temperatures for each of the respective zones 236. The macro TCE controller 304 controls the macro TCEs 212 according to the received process setpoint or setpoints. The micro TCEs 216 can then be controlled to achieve the process setpoint throughout each of the zones 236, thereby compensating for temperature non-uniformities in the zones 236.

The ESC temperature estimation module 320 estimates the temperature of the ESC 200 according to feedback provided by the macro TCE controller 304, the micro TCE controller 308, and one or more inputs 324. The estimated ESC temperature may be dependent upon, for example, zone temperatures (i.e., temperatures in the zones 236 as controlled by the macro TCE controller 304), local temperatures (i.e., as controlled by the micro TCE controller 308), bias RF power, TCP RF power, and baseplate temperature. The temperature estimation module 320 estimates the ESC temperature according to respective models (e.g., stored in the memory 312) for each of the inputs associated with the ESC temperature. For example only, each of the models associates a respective temperature contribution to the ESC temperature for each of the inputs.

In one example, the temperature estimation module 320 receives indications of voltage and current associated with each of the micro TCEs 216. For example, the temperature estimation module 320 may receive indications of voltages provided to the micro TCEs 216 from the micro TCE controller 308, and may receive measurements of currents flowing through the micro TCEs 216 via respective current sensors 328 connected in series with the micro TCEs 216. A respective resistance of each of the micro TCEs 216 may then be calculated (e.g., using a model) according to the received voltage and current information. The resistance of each of the micro TCEs 216 is indicative of a temperature of the ESC 200 in the corresponding location since the micro TCEs 216 comprise resistive heating elements. In other words, the resistance of each of the micro TCEs 216 is a function of temperature, and therefore the calculated resistance of each of the micro TCEs 216 may be mapped to a corresponding temperature. The temperature estimation module 320 calculates the temperature contribution to the ESC temperature for each of the micro TCE temperatures accordingly as described below in more detail.

Figure 4:
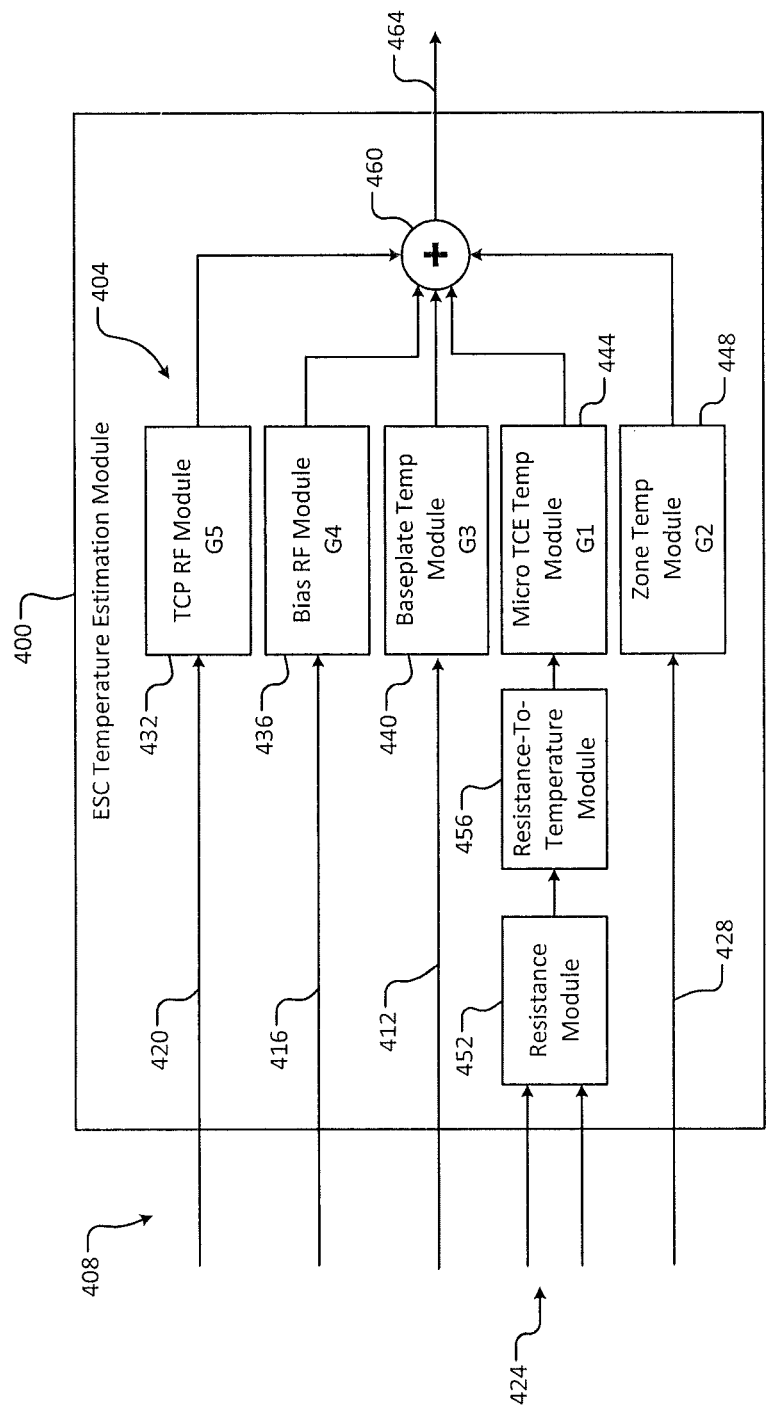
FIG. 4 is an example temperature estimation module according to the principles of the present disclosure.

Referring now to FIG. 4, an example ESC temperature estimation module 400 includes one or more modules 404 configured to receive a respective one of inputs 408 and generate a corresponding contribution to ESC temperature accordingly, which may be referred to as a temperature response. The temperature responses may each correspond to a product of a model coefficient (e.g., G1, G2, G3, G4, and G5) and a respective one of the inputs 408. For example, the inputs 408 may include a baseplate temperature 412, a bias RF power 416, a TCP RF power 420, voltage and current measurements 424 for each of the micro TCEs 216, and power inputs 428 provided to the macro TCEs 212.

The modules 404 may include a TCP RF module 432, a bias RF module 436, a baseplate temperature module 440, a micro TCE temperature module 444, and a zone temperature module 448. The temperature estimation module 400 may further include a resistance module 452 and a resistance-to-temperature module 456. For example, the resistance module 452 calculates a respective resistance of each of the micro TCEs 216 based on the corresponding voltage and current measurements 424. The resistance-to-temperature module 456 calculates temperatures (e.g., using a map that correlates a resistance to a temperature for each of the micro TCEs 216) based on the resistances calculated by the resistance module 452. The resistance-to-temperature module 456 provides the calculated resistances to the micro TCE temperature module 444.

Each of the modules 404 implements a respective model to generate and output the temperature responses based on the respective inputs 408. For example only, as described below in more detail, the models implemented by the modules 444, 448, 440, 436, and 432 are represented by G1, G2, G3, G4, and G5, respectively. Outputs of the modules 404 are summed at a summing node 460 to generate an ESC temperature estimate 464. Temperatures of the ESC 200 can be further controlled to achieve a desired temperature using the ESC temperature estimate 464. For example, voltages/power provided to the macro TCEs 212 and the micro TCEs 216 may be adjusted based on the ESC temperature estimate 464 to more accurately achieve desired temperatures.

Accordingly, the temperature estimate 464 ("temp") corresponds to temp=G1*MicroTemp+G2*MacroPower+G3*BaseplateTemp+G4*BiasPower+G5*TCPPower, where MicroTemp, MacroPower, BaseplateTemp, BiasPower, and TCPPower correspond to the inputs 408 to the modules 444, 448, 440, 436, and 432 respectively. Accordingly, each of the inputs 408 is modified by a respective one of the models G1, G2, G3, G4, and G5.

For example only, the model G2 may correspond to $$G2 = \frac{k}{Ts+1}e^{-Ls},$$

where k is a plant gain associated with the macro TCEs 212, L is a time delay associated with the macro TCEs 212, and T is a time constant associated with the macro TCEs 212. For example, the time delay may correspond to a temperature response delay. The model G3 may correspond to $$G3 = \frac{k_{base}}{T_{base}s+1}e^{-L_{base}s},$$

where $k_{base}$ is a plant gain associated with the baseplate, $L_{base}$ is a time delay associated with the baseplate, and $T_{base}$ is a time constant associated with the baseplate. The model G4 may correspond to $$G4 = \frac{k_{bias}}{T_{bias}s+1}e^{-L_{bias}s},$$

where $k_{bias}$ is a plant gain associated with the bias RF power, $L_{bias}$ is a time delay associated with the bias RF power, and $T_{bias}$ is a time constant associated with the bias RF power. The model G5 may correspond to $$G5 = \frac{k_{tcp}}{T_{tcp}s+1}e^{-L_{tcp}s},$$

where $k_{tcp}$ is a plant gain associated with the TCP RF power, $L_{tcp}$ is a time delay associated with the TCP RF power, and $T_{tcp}$ is a time constant associated with the TCP RF power.

Figure 5A:
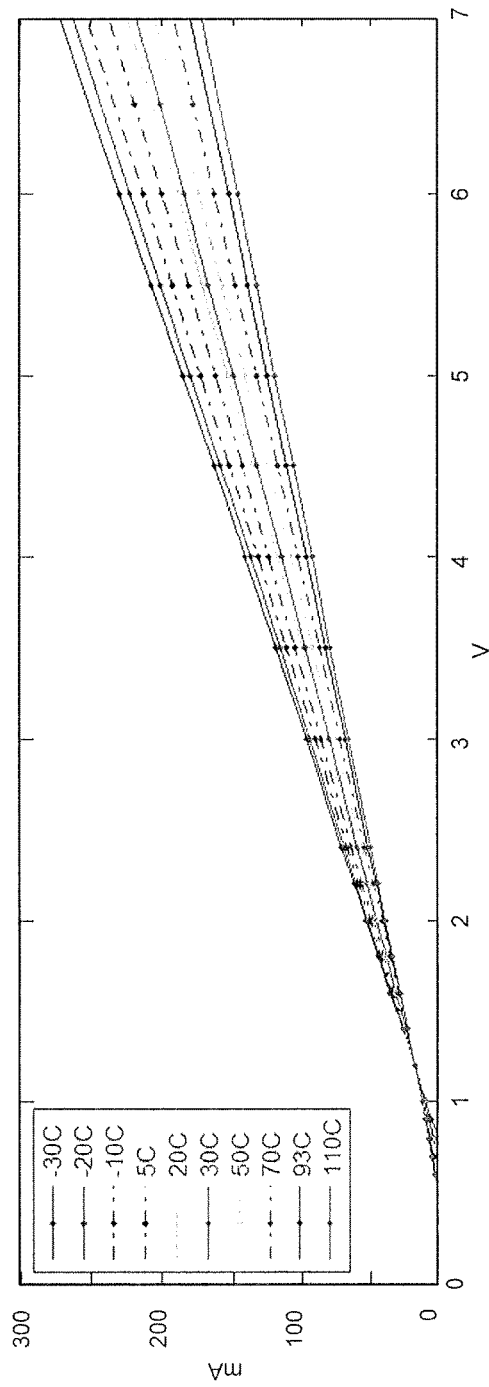
FIG. 5A illustrates measured voltage and current for each of a plurality of temperatures of a thermal control element according to the principles of the present disclosure.

The model G1 may be calculated by measuring voltage and current for each of the micro TCEs 216 at a plurality of temperatures as shown in FIG. 5A. In one example, an array of the micro TCEs 216 (e.g., corresponding to the micro TCEs 216 embedded within the ESC 200 as shown in FIGS. 2A, 2B, and 2C) may be arranged within an oven or process chamber configured to maintain a desired temperature. With the oven at each of the plurality of temperatures (e.g., in a range from −40 to 130° C.), a voltage is provided to the micro TCEs 216 and a corresponding current is measured. In this manner, corresponding voltages and currents for each of the micro TCEs 216 at each of the respective temperatures may be determined.

Figure 5B:
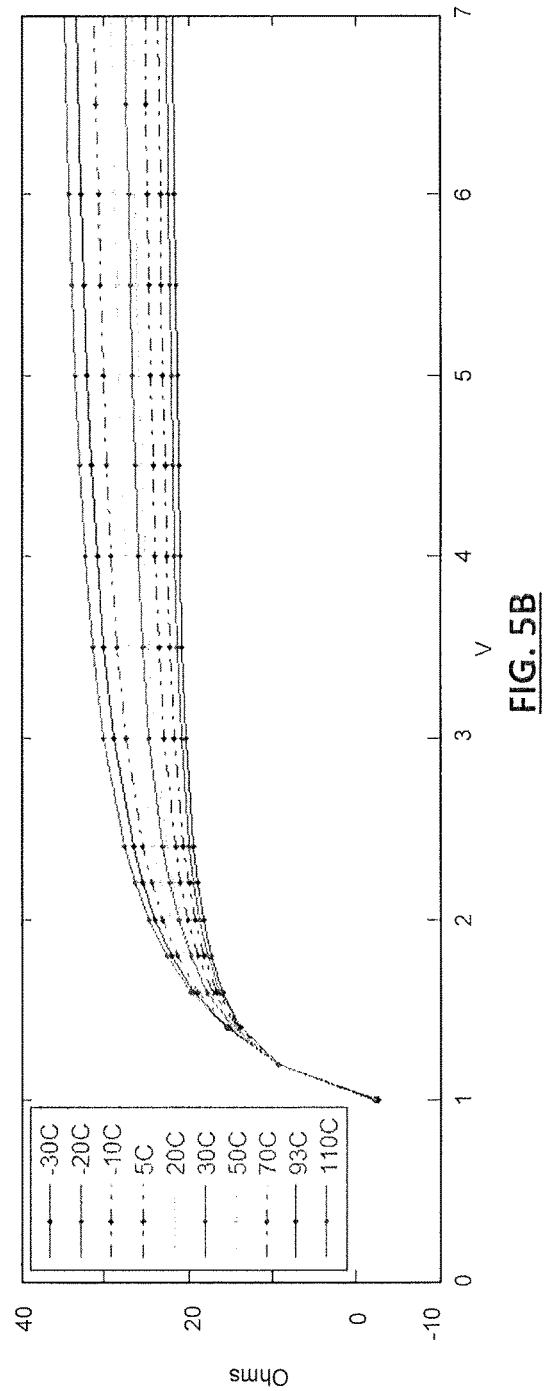
FIG. 5B illustrates a calculated resistance relative to a measured voltage for each of a plurality of temperatures of a thermal control element according to the principles of the present disclosure.
Figure 6:
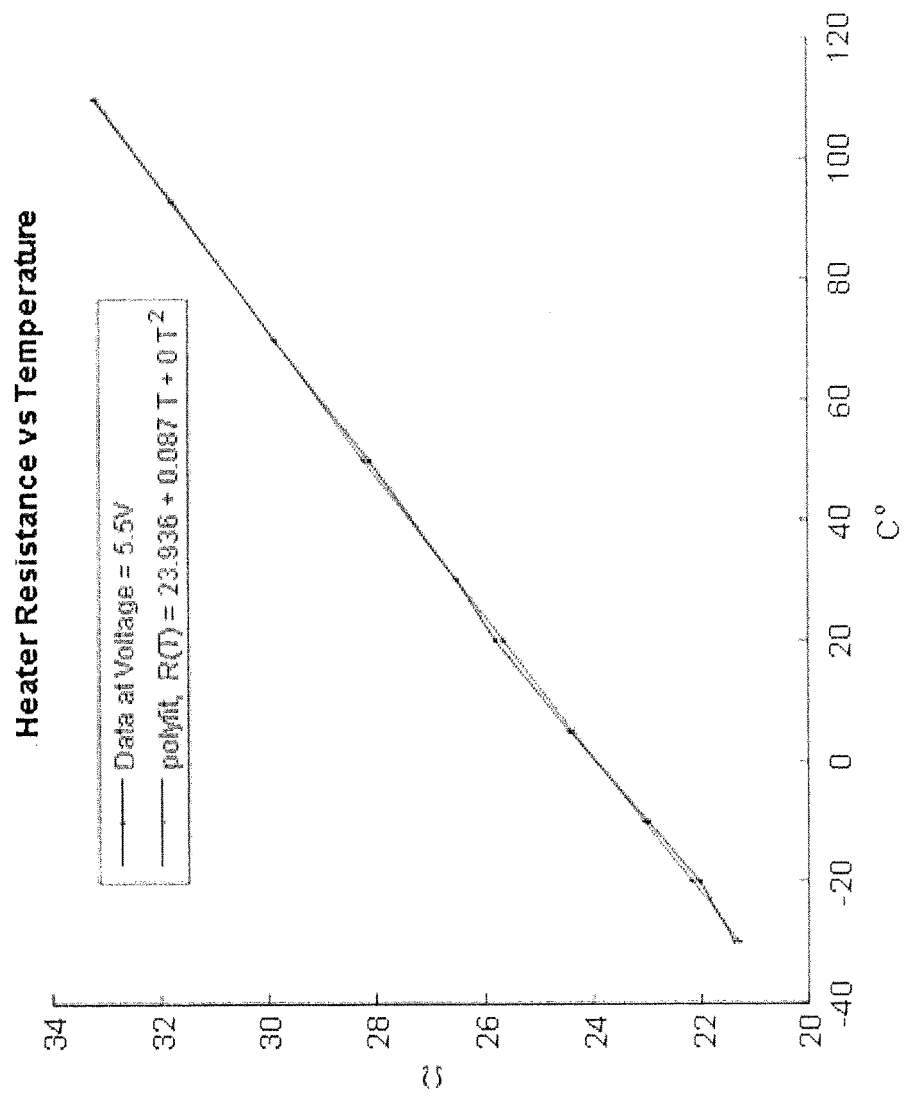
FIG. 6 illustrates a relationship between resistance and temperature of a thermal control element according to the principles of the present disclosure.

A resistance at each temperature may then be calculated using the measured voltages and currents. FIG. 5B illustrates the relationship between the calculated resistance and the voltage for each of the plurality of temperatures. Accordingly, a temperature sensitivity (i.e., a sensitivity of a resistance of a selected one of the micro TCEs 216 to changes in temperature) may be determined. This determination may be performed for one of the micro TCEs 216, a predetermined portion of the micro TCEs 216, all of the micro TCEs 216, etc. As shown in FIG. 6, a relationship between a resistance of the micro TCEs 216 and a corresponding temperature is approximately linear. In this manner, the resistance-to-temperature module 456 may implement a map or model that correlates a resistance (e.g., calculated based on voltage and current measurements 424) to an estimated temperature for each of the micro TCEs 216.

Figure 7:
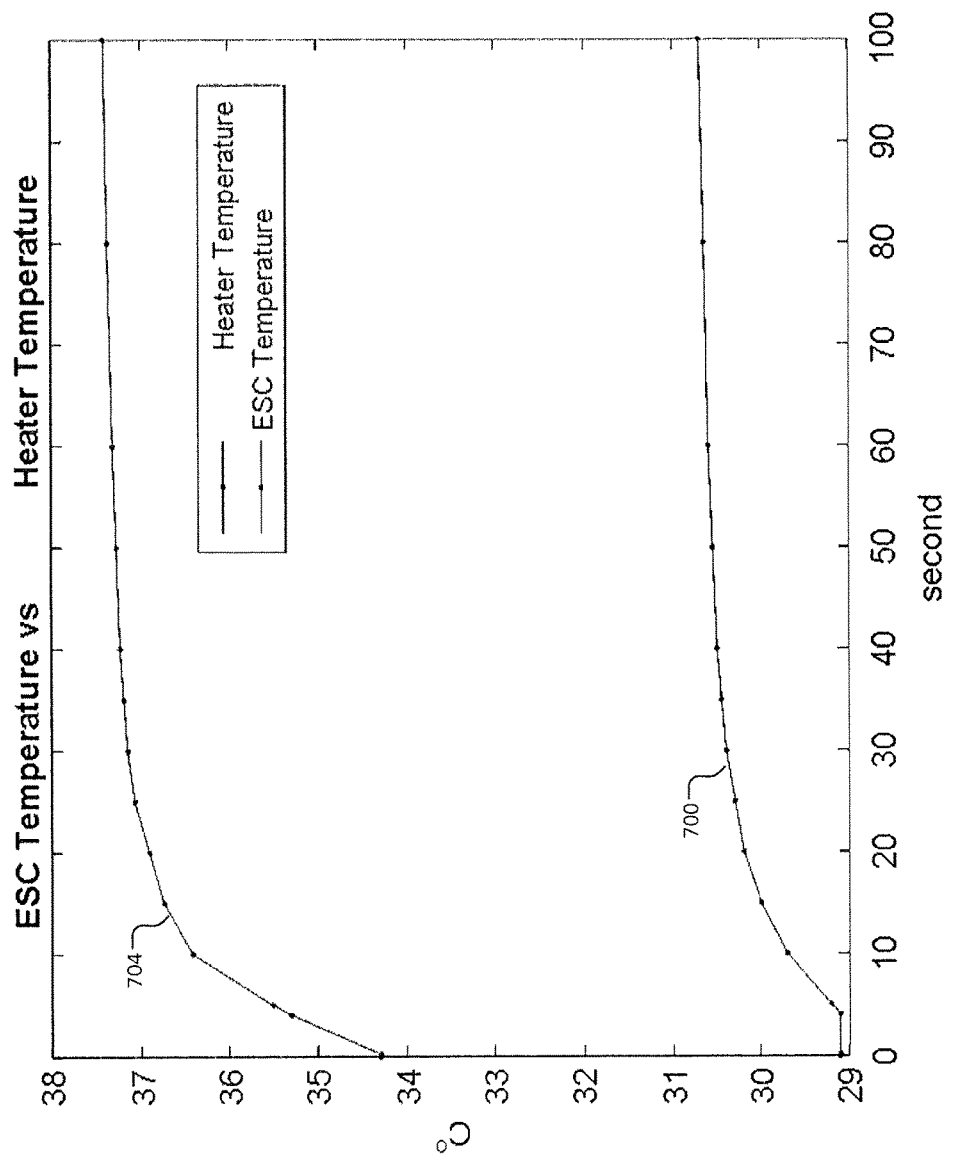
FIG. 7 illustrates an example temperature response at a surface location of an electrostatic chuck according to the principles of the present disclosure.

Temperature responses at respective locations of the ESC 200 may be determined for each of the micro TCEs 216. For example, a thermocouple or other temperature sensor may be arranged on an upper surface of the ESC 200 at a location corresponding to a selected one of the micro TCEs 216. FIG. 7 illustrates a temperature response 700 at a surface location of the ESC 200 relative to a temperature 704 of a corresponding one of the micro TCEs 216. As shown, the temperature 704 is offset from (i.e., greater than) the temperature response 700 of the ESC 200 approximately 5-8° C. Further, a temperature response of the micro TCE 216 is faster than the temperature response 700 of the ESC 200. For example, the temperature response 700 may have a delay of approximately 4 seconds relative to the increase in the temperature 704. As shown, a time constant of the temperature response of the micro TCE is approximately 9 seconds, while a time constant of the temperature response 700 is approximately 14 seconds.

Figure 8:
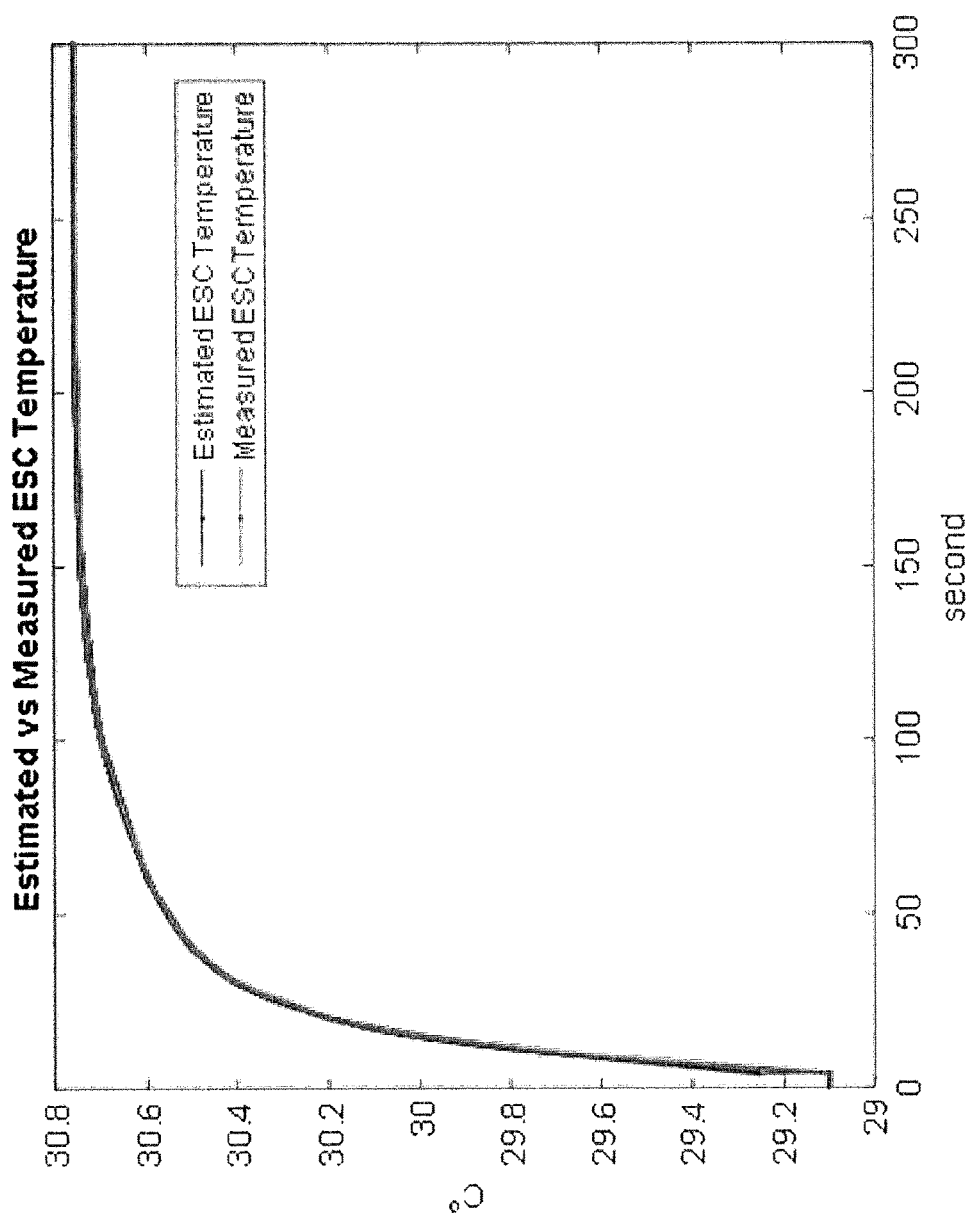
FIG. 8 illustrates an estimated temperature of an electrostatic chuck using an example model according to the principles of the present disclosure.

The model G1 is calculated according to the observed relationship (e.g., as shown in FIG. 7) between the temperature response 704 of the ESC 200 and the corresponding estimated temperature 700 of the micro TCE 216. In one example, the model G1 may correspond to:

$$G1 = \text{Offset} + \text{Gain} * \frac{0.2241 S^5 + 5.548 S^4 + 56.7 S^3 + 2.918 S^2 + 0.8272 s + 0.02293}{s^6 + 2.232 S^5 + 290.7 S^4 + 80.7 S^3 + 7.33 S^2 + 1.077 s + 0.02289} e^{-Ls},$$

where Offset, Gain, delay L correspond to predetermined constants, and s is time in seconds. For example, Offset may correspond to an offset between the temperature 704 and the temperature response 700. FIG. 8 illustrates an estimated temperature of the ESC 200 using the model G1 relative to an actual measured temperature of the ESC 200. Although described herein as linear dynamic models, in some examples one or more of the models G1, G2, G3, G4, and G5 may correspond to other model types, such as higher order models, nonlinear models, etc.

Figure 9:
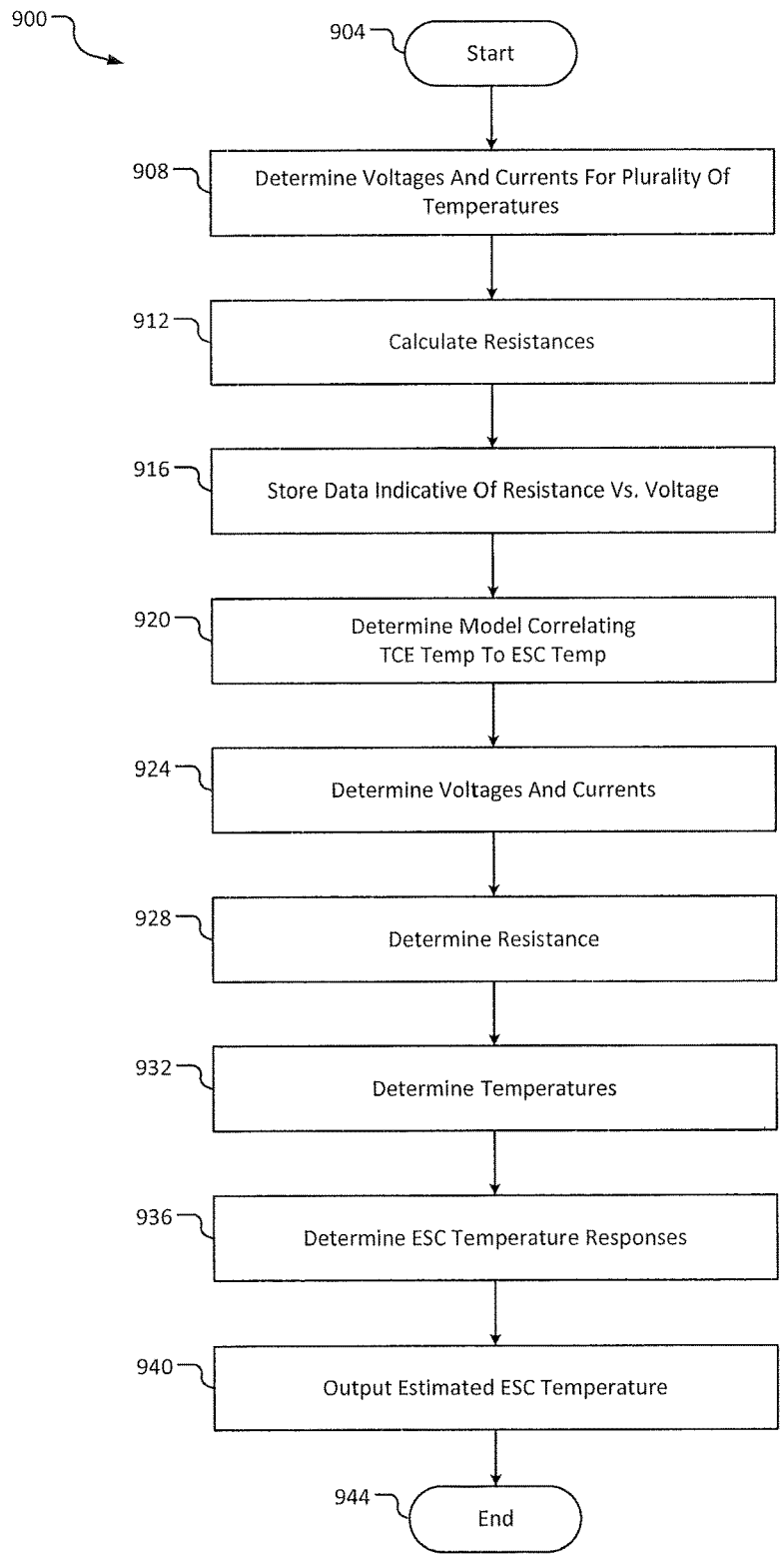
FIG. 9 illustrates steps of an example temperature estimation method according to the principles of the present disclosure.

Referring now to FIG. 9, an example ESC temperature estimation method 900 begins at 904. At 908, the method 900 determines voltages and currents of a plurality of heating elements or heaters (e.g., the micro TCEs 216) of an ESC at a plurality of temperatures. At 912, the method 900 calculates resistances of the micro TCEs 216 at each of the plurality of temperatures using the determined voltages and currents. At 916, the method stores data indicative of a relationship between the voltages and the calculated resistances at each of the plurality of temperatures. For example, the stored data may be incorporated in a map or model implemented by the resistance-to-temperature module 456. At 920, the method 900 determines and stores a model correlating the temperatures of the micro TCEs 216 to respective surface locations on the ESC 200.

At 924, during substrate processing, the method 900 (e.g., the ESC temperature estimation module 400) determines voltages and currents of the micro TCEs 216. At 928, the method 900 (e.g., the resistance module 452) determines resistances of the micro TCEs 216 based on the determined voltages and currents. At 932, the method 900 (e.g., the resistance-to-temperature module 456) determines temperatures of the micro TCEs 216 based on the resistances. At 936, the method 900 (e.g., the micro TCE temperature module 444 implementing the stored model) determines respective surface temperature responses of the ESC 200 based on the determined temperatures of the micro TCEs 216. At 940, the method 900 (e.g., the temperature estimation module 400) generates and outputs an estimated temperature of the ESC 200. For example, the estimated temperature of the ESC 200 may be generated based on the temperature responses determined at 936, as well as temperature responses calculated for other inputs using respective models G2, G3, G4, and G5 as described above in FIG. 4. The method 900 ends at 944.

The foregoing description is merely illustrative in nature and is in no way intended to limit the disclosure, its application, or uses. The broad teachings of the disclosure can be implemented in a variety of forms. Therefore, while this disclosure includes particular examples, the true scope of the disclosure should not be so limited since other modifications will become apparent upon a study of the drawings, the specification, and the following claims. It should be understood that one or more steps within a method may be executed in different order (or concurrently) without altering the principles of the present disclosure. Further, although each of the embodiments is described above as having certain features, any one or more of those features described with respect to any embodiment of the disclosure can be implemented in and/or combined with features of any of the other embodiments, even if that combination is not explicitly described. In other words, the described embodiments are not mutually exclusive, and permutations of one or more embodiments with one another remain within the scope of this disclosure.

Spatial and functional relationships between elements (for example, between modules, circuit elements, semiconductor layers, etc.) are described using various terms, including "connected," "engaged," "coupled," "adjacent," "next to," "on top of," "above," "below," and "disposed." Unless explicitly described as being "direct," when a relationship between first and second elements is described in the above disclosure, that relationship can be a direct relationship where no other intervening elements are present between the first and second elements, but can also be an indirect relationship where one or more intervening elements are present (either spatially or functionally) between the first and second elements. As used herein, the phrase at least one of A, B, and C should be construed to mean a logical (A OR B OR C), using a non-exclusive logical OR, and should not be construed to mean "at least one of A, at least one of B, and at least one of C."

In some implementations, a controller is part of a system, which may be part of the above-described examples. Such systems can comprise semiconductor processing equipment, including a processing tool or tools, chamber or chambers, a platform or platforms for processing, and/or specific processing components (a wafer pedestal, a gas flow system, etc.). These systems may be integrated with electronics for controlling their operation before, during, and after processing of a semiconductor wafer or substrate. The electronics may be referred to as the "controller," which may control various components or subparts of the system or systems. The controller, depending on the processing requirements and/or the type of system, may be programmed to control any of the processes disclosed herein, including the delivery of processing gases, temperature settings (e.g., heating and/or cooling), pressure settings, vacuum settings, power settings, radio frequency (RF) generator settings, RF matching circuit settings, frequency settings, flow rate settings, fluid delivery settings, positional and operation settings, wafer transfers into and out of a tool and other transfer tools and/or load locks connected to or interfaced with a specific system.

Broadly speaking, the controller may be defined as electronics having various integrated circuits, logic, memory, and/or software that receive instructions, issue instructions, control operation, enable cleaning operations, enable endpoint measurements, and the like. The integrated circuits may include chips in the form of firmware that store program instructions, digital signal processors (DSPs), chips defined as application specific integrated circuits (ASICs), and/or one or more microprocessors, or microcontrollers that execute program instructions (e.g., software). Program instructions may be instructions communicated to the controller in the form of various individual settings (or program files), defining operational parameters for carrying out a particular process on or for a semiconductor wafer or to a system. The operational parameters may, in some embodiments, be part of a recipe defined by process engineers to accomplish one or more processing steps during the fabrication of one or more layers, materials, metals, oxides, silicon, silicon dioxide, surfaces, circuits, and/or dies of a wafer.

The controller, in some implementations, may be a part of or coupled to a computer that is integrated with the system, coupled to the system, otherwise networked to the system, or a combination thereof. For example, the controller may be in the "cloud" or all or a part of a fab host computer system, which can allow for remote access of the wafer processing. The computer may enable remote access to the system to monitor current progress of fabrication operations, examine a history of past fabrication operations, examine trends or performance metrics from a plurality of fabrication operations, to change parameters of current processing, to set processing steps to follow a current processing, or to start a new process. In some examples, a remote computer (e.g. a server) can provide process recipes to a system over a network, which may include a local network or the Internet. The remote computer may include a user interface that enables entry or programming of parameters and/or settings, which are then communicated to the system from the remote computer. In some examples, the controller receives instructions in the form of data, which specify parameters for each of the processing steps to be performed during one or more operations. It should be understood that the parameters may be specific to the type of process to be performed and the type of tool that the controller is configured to interface with or control. Thus as described above, the controller may be distributed, such as by comprising one or more discrete controllers that are networked together and working towards a common purpose, such as the processes and controls described herein. An example of a distributed controller for such purposes would be one or more integrated circuits on a chamber in communication with one or more integrated circuits located remotely (such as at the platform level or as part of a remote computer) that combine to control a process on the chamber.

Without limitation, example systems may include a plasma etch chamber or module, a deposition chamber or module, a spin-rinse chamber or module, a metal plating chamber or module, a clean chamber or module, a bevel edge etch chamber or module, a physical vapor deposition (PVD) chamber or module, a chemical vapor deposition (CVD) chamber or module, an atomic layer deposition (ALD) chamber or module, an atomic layer etch (ALE) chamber or module, an ion implantation chamber or module, a track chamber or module, and any other semiconductor processing systems that may be associated or used in the fabrication and/or manufacturing of semiconductor wafers.

As noted above, depending on the process step or steps to be performed by the tool, the controller might communicate with one or more of other tool circuits or modules, other tool components, cluster tools, other tool interfaces, adjacent tools, neighboring tools, tools located throughout a factory, a main computer, another controller, or tools used in material transport that bring containers of wafers to and from tool locations and/or load ports in a semiconductor manufacturing factory.

What is claimed is:

1. A temperature controller for a substrate support in a substrate processing system, the temperature controller comprising:
    memory that stores a first model correlating (i) temperatures of a plurality of first thermal control elements (TCEs) arranged in the substrate support and (ii) first temperature responses of the substrate support, wherein the first temperature responses correspond to locations on a surface of the substrate support, and wherein the first TCEs are configured to heat the substrate support; and
    a temperature estimation module that (i) calculates resistances of the first TCEs, (ii) determines, based on the calculated resistances, the temperatures of the first TCEs, and (iii) estimates, using the stored first model and the temperatures of the first TCEs as determined based on the calculated resistances, an actual temperature response of the substrate support,
    wherein the temperature controller is configured to control the first TCEs to heat the substrate support based on the actual temperature response of the substrate support.

2. The temperature controller of claim 1, wherein:
    the memory further stores at least one of
        a second model correlating (i) power provided to second TCEs arranged in the substrate support and (ii) second temperature responses of the substrate support,
        a third model correlating (i) a temperature of a baseplate of the substrate support and (ii) third temperature responses of the substrate support,
        a fourth model correlating (i) a bias radio frequency (RF) power provided to the substrate support and (ii) fourth temperature responses of the substrate support, and
        a fifth model correlating (i) plasma RF power provided to the substrate processing system and (ii) fifth temperature responses of the substrate support.

3. The temperature controller of claim 2, wherein, to estimate the actual temperature response of the substrate support, the temperature estimation module estimates the actual temperature response further based on the stored at least one of the second model, the third model, the fourth model, and the fifth model.

4. The temperature controller of claim 2, wherein the temperature estimation module estimates the actual temperature response based on a sum of outputs of the first model and the at least one of the second model, the third model, the fourth model, and the fifth model.

5. The temperature controller of claim 2, wherein the at least one of the second model, the third model, the fourth model, and the fifth model corresponds to $$\frac{k}{Ts+1}e^{-Ls},$$

where k is a plant gain, L is a time delay, and T is a time constant.

6. The temperature controller of claim 5, wherein an output of the at least one of the second model, the third model, the fourth model, and the fifth model corresponds to a product of $$\frac{k}{Ts+1}e^{-Ls}$$

and a respective input.

7. The temperature controller of claim 1, wherein the first model corresponds to $$\text{Offset} + \text{Gain} * \frac{0.2241S^5 + 5.548S^4 + 56.7S^3 + 2.918S^2 + 0.8272s + 0.02293}{s^6 + 2.232S^5 + 290.7S^4 + 80.7S^3 + 7.33S^2 + 1.077s + 0.02289}e^{-Ls},$$

where Offset corresponds to an offset between temperatures of the first TCEs and the first temperature responses, Gain corresponds to a gain of the first model, L corresponds to a time delay, and s corresponds to time in seconds.

8. The temperature controller of claim 1, wherein the memory stores a second model correlating (i) the calculated resistances and (ii) the temperatures of the first TCEs, and wherein the temperature estimation module determines the temperatures of the first TCEs using the second model and the calculated resistances.

9. A method of estimating temperatures of a substrate support in a substrate processing system, the method comprising:
storing a first model correlating (i) temperatures of a plurality of first thermal control elements (TCEs) arranged in the substrate support and (ii) first temperature responses of the substrate support, wherein the first temperature responses correspond to locations on a surface of the substrate support, wherein the first TCEs are configured to heat the substrate support;
calculating resistances of the first TCEs;
determining, based on the calculated resistances, the temperatures of the first TCEs;
estimating, using the stored first model and the temperatures of the first TCEs as determined based on the calculated resistances, an actual temperature response of the substrate support; and
controlling the first TCEs to heat the substrate support based on the actual temperature response of the substrate support.

10. The method of claim 9, further comprising:
storing at least one of
a second model correlating (i) power provided to second TCEs arranged in the substrate support and (ii) second temperature responses of the substrate support,
a third model correlating (i) a temperature of a baseplate of the substrate support and (ii) third temperature responses of the substrate support,
a fourth model correlating (i) a bias radio frequency (RF) power provided to the substrate support and (ii) fourth temperature responses of the substrate support, and
a fifth model correlating (i) plasma RF power provided to the substrate processing system and (ii) fifth temperature responses of the substrate support.

11. The method of claim 10, wherein estimating the actual temperature response of the substrate support includes estimating the actual temperature response further based on the stored at least one of the second model, the third model, the fourth model, and the fifth model.

12. The method of claim 10, wherein estimating the actual temperature response includes estimating the actual temperature response based on a sum of outputs of the first model and the at least one of the second model, the third model, the fourth model, and the fifth model.

13. The method of claim 10, wherein the at least one of the second model, the third model, the fourth model, and the fifth model corresponds to $$\frac{k}{Ts+1}e^{-Ls},$$

where k is a plant gain, L is a time delay, and T is a time constant.

14. The method of claim 13, wherein an output of the at least one of the second model, the third model, the fourth model, and the fifth model corresponds to a product of $$\frac{k}{Ts+1}e^{-Ls},$$

and a respective input.

15. The method of claim 9, wherein the first model corresponds to $$\text{Offset} + \text{Gain} * \frac{0.2241S^5 + 5.548S^4 + 56.7S^3 + 2.918S^2 + 0.8272s + 0.02293}{s^6 + 2.232S^5 + 290.7S^4 + 80.7S^3 + 7.33S^2 + 1.077s + 0.02289}e^{-Ls},$$

where Offset corresponds to an offset between temperatures of the first TCEs and the first temperature responses, Gain corresponds to a gain of the first model, L corresponds to a time delay, and s corresponds to time in seconds.

16. The method of claim 9, further comprising storing a second model correlating (i) the calculated resistances and (ii) the temperatures of the first TCEs, and further comprising determining the temperatures of the first TCEs using the second model and the calculated resistances.

* * * * *